United States Patent
Kim et al.

(10) Patent No.: US 7,791,146 B2
(45) Date of Patent: Sep. 7, 2010

(54) SEMICONDUCTOR DEVICE INCLUDING FIELD EFFECT TRANSISTOR AND METHOD OF FORMING THE SAME

(75) Inventors: Myung-Sun Kim, Hwaseong-si (KR); Hwa-Sung Rhee, Seongnam-si (KR); Tetsuji Ueno, Suwon-si (KR); Ho Lee, Cheoan-si (KR); Ji-Hye Yi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 148 days.

(21) Appl. No.: 11/857,157

(22) Filed: Sep. 18, 2007

(65) Prior Publication Data
US 2008/0067609 A1    Mar. 20, 2008

(30) Foreign Application Priority Data
Sep. 20, 2006    (KR) .................. 10-2006-0091360

(51) Int. Cl.
*H01L 29/76* (2006.01)
(52) U.S. Cl. ..................... 257/384; 257/616
(58) Field of Classification Search ............... 257/384, 257/616
See application file for complete search history.

(56) References Cited
U.S. PATENT DOCUMENTS 6,737,324 B2    5/2004    Chang
7,432,559 B2 *  10/2008   Lai et al. ............. 257/377
2005/0253200 A1 11/2005  Murthy et al.

FOREIGN PATENT DOCUMENTS

| KR | 2000-0050568 | 8/2000 |
| KR | 1020010045773 | 6/2001 |
| KR | 2002-0054108 | 7/2002 |
| WO | WO-2004-038807 A1 | 5/2004 |
| WO | WO-2006-011939 A2 | 2/2006 |

OTHER PUBLICATIONS

English Abstract Publication No. 1020020054108, Jul. 2002.
English Abstract Publication No. 1020000050568, Aug. 2000.
English Abstract for Publication No. 1020010045773, Jun. 2001.

* cited by examiner

*Primary Examiner*—Mark Prenty
(74) *Attorney, Agent, or Firm*—F. Chau & Associates, LLC

(57) ABSTRACT

A semiconductor device includes a gate insulator and a gate electrode stacked on a substrate, a source/drain pattern which fills a recess region formed at opposite sides adjacent to the gate electrode, the source/drain pattern being made of silicon-germanium doped with dopants and a metal germanosilicide layer disposed on the source/drain pattern. The metal germanosilicide layer is electrically connected to the source/drain pattern. Moreover, a proportion of germanium amount to the sum of the germanium amount and silicon amount in the metal germanosilicide layer is lower than that of germanium amount to the sum of the germanium amount and silicon amount in the source/drain pattern.

9 Claims, 6 Drawing Sheets

SEMICONDUCTOR DEVICE INCLUDING FIELD EFFECT TRANSISTOR AND METHOD OF FORMING THE SAME

CROSS-REFERENCE TO RELATED APPLICATIONS

This U.S. non-provisional patent application claims priority under 35 U.S.C §119 of Korean Patent Application 2006-91360 filed on Sep. 20, 2006, the disclosure of which is hereby incorporated by reference herein in its entirety.

BACKGROUND

The present disclosure relates to a semiconductor device and methods of forming the same. More specifically, the present disclosure is directed to a semiconductor device including a field effect transistor and a method of forming the same.

A field effect transistor (hereinafter referred to as "transistor") is one of elements constituting a semiconductor device. Conventionally, a transistor includes a source region and a drain region formed on a semiconductor substrate to be spaced apart from each other and a gate electrode disposed to cover the top of a channel region between the source and drain regions. The formation of the source and drain regions is done by implanting dopant ions into the substrate. The gate electrode is insulated from the channel region by a gate oxide layer interposed between the substrate and the gate electrode. Such a transistor is widely being used as a single element constituting a switching device and/or a logic circuit in a semiconductor device.

In recent years, the operating speeds of semiconductor devices have been made higher while scales thereof have become smaller. Thus, transistors are decreasing in size. As a result, the turn-on current of a transistor may decrease to reduce the operating speed of the transistor. Moreover, the contact resistance between a drain region (or a source region) of a transistor and a contact structure may increase to reduce the operating speed of the transistor. Due to these causes, the operating speeds of semiconductor devices may be reduced. Accordingly, various studies have been conducted to enhance the operating speed of a highly integrated transistor.

SUMMARY OF THE INVENTION

Exemplary embodiments of the present invention are directed a semiconductor device and a method of forming the same. In accordance with an exemplary embodiment of the present invention, a semiconductor device is provided. The semiconductor device includes a gate insulator and a gate electrode stacked on a substrate, a source/drain pattern which fills a recess region formed at opposite sides adjacent to the gate electrode, the source/drain pattern being made of silicon-germanium doped with dopants and a metal germanosilicide layer disposed on the source/drain pattern. The metal germanosilicide layer is electrically connected to the source/drain pattern. Moreover, a proportion of germanium amount to the sum of the germanium amount and silicon amount in the metal germanosilicide layer is lower than that of germanium amount to the sum of the germanium amount and silicon amount in the source/drain pattern.

In accordance with an exemplary embodiment of the present invention, a method of forming a semiconductor device is provided. The method includes forming a gate pattern on a substrate, the gate pattern including a gate insulator and a gate electrode stacked on the substrate, etching a substrate adjacent to opposite sides of the gate pattern to form a recess region, forming a source/drain pattern of silicon-germanium doped with dopants to fill the recess region; forming a capping layer of silicon-germanium on the source/drain pattern; forming a metal layer on the capping layer and reacting the metal layer with the capping layer by performing an annealing process to form a metal germanosilicide layer, wherein a proportion of germanium amount to the sum of the germanium amount and silicon amount in the capping layer is lower than that of germanium amount to the sum of the germanium amount and silicon amount in the source/drain pattern.

DETAILED DESCRIPTION OF EXEMPLARY EMBODIMENTS OF THE PRESENT INVENTION

Figure 1:
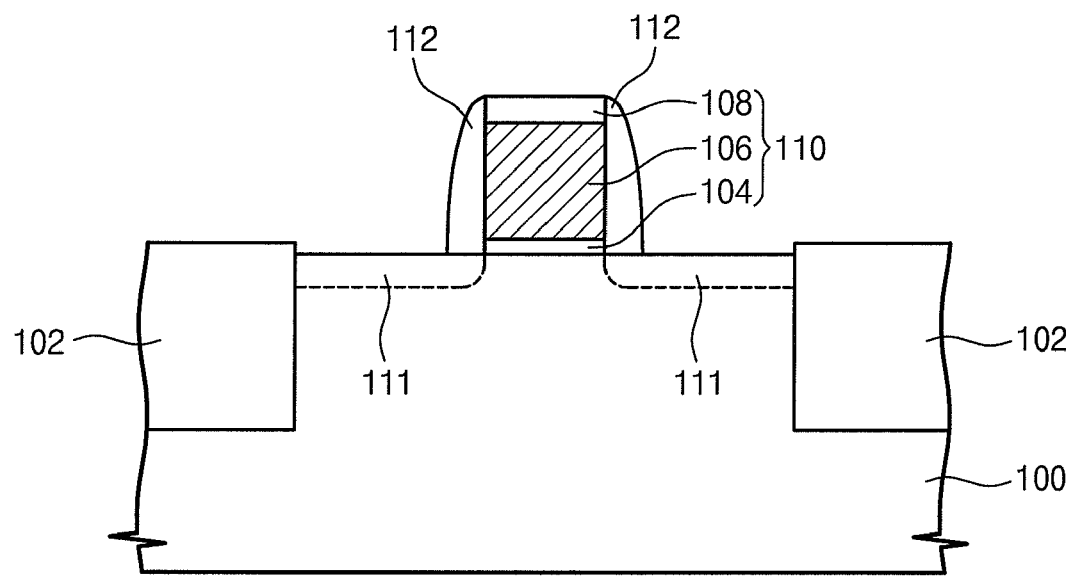
FIGS. 1 through 6 are cross-sectional views illustrating a method of forming a semiconductor device according to an exemplary embodiment of the present invention.

This invention, however, may be embodied in many different forms and should not be construed as limited to the exemplary embodiments set forth herein. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 1 through 6 are cross-sectional views illustrating a method of forming a semiconductor device according to an exemplary embodiment of the present invention.

Referring to FIG. 1, a device isolation layer 102 is formed at a semiconductor substrate 100 (hereinafter referred to as "substrate") to define an active region. The substrate 100 may be, for example, a silicon substrate. The device isolation layer 102 may be a trench isolation layer. The active region is doped with first-type dopants.

A gate pattern 110 is formed on the active region. The gate pattern 110 includes a gate insulator 104, a gate electrode 106, and a hard mask pattern 108, which are stacked in the order listed. The gate insulator 104 may be formed of, for example, oxide. Alternatively, the gate insulator 104 may be formed of another insulating material. The gate electrode 106 is formed of a conductive material. The gate electrode 106 may include at least one selected from the group consisting of, for example, doped silicon, conductive metal nitride (e.g., titanium nitride, tantalum nitride, etc.), metal (e.g., tungsten, molybdenum, etc.), and metal silicide. In this embodiment, the gate electrode 106 is formed of doped silicon.

Using the gate pattern 110 as a mask, second-type dopant ions are implanted into the active region to form a dopant-doped region 111. In some cases, the formation of the dopant-doped region 111 may be omitted.

A spacer layer is formed on the entire surface of the substrate 100. The spacer layer is anisotropically etched to form a gate spacer 112 on opposite sidewalls of the gate pattern 110. The gate spacer 112 is formed of an insulating material. The hard mask pattern 108 and the gate spacer 112 are each made of an insulating material having an etch selectivity with respect to the active region (e.g., the substrate 100). The hard mask pattern 108 and the gate spacer 112 may have an etch selectivity with respect to each other. In this case, the hard mask pattern 108 may be formed of one of nitride and oxide and the gate spacer 112 may be formed of the other. Alternatively, the hard mask pattern 108 and the gate spacer 112 may include materials having the same etch rate. In this case, both the hard mask pattern 108 and the gate spacer 112 may include nitride.

Figure 2:
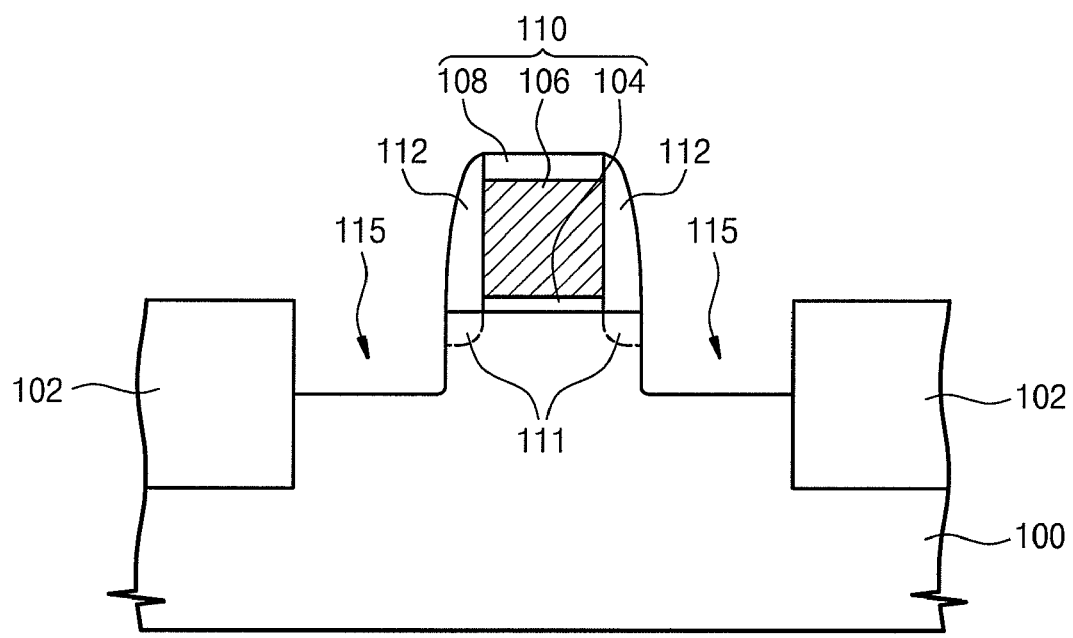

Referring to FIG. 2, using the gate pattern 110 and the gate spacer 112 as a mask, the active region is etched to form a recess region 115. The formation of the recess region 115 may be done by means of, for example, an anisotropic etch. In this case, a trimming process may be performed after the formation of the recess region 115. The trimming process includes a thermal oxidation process and a wet etch process performed to remove a thermal oxide layer. Due to the trimming process, etching damage of a sidewall and a bottom surface of the recess region 115 may be cured. In the case where the formation of the recess region 115 is done by means of the anisotropic etch, a process of forming the dopant-doped region 111 may be performed.

Alternatively, the formation of the recess region 115 may be done by means of an isotropic etch, especially, a wet etch. In this case, the recess region 115 may extend underneath the gate spacer 112. When the formation of the recess region 115 is done by means of a wet etch, the trimming process may be omitted. The recess region 115 extends underneath the gate spacer 112, so that the dopant-doped region 11 may be omitted.

In the present exemplary embodiment, the recess region 115 is formed by means of an anisotropic etch. A portion of the dopant-doped region 111 may remain below the gate spacer 112.

Figure 3:
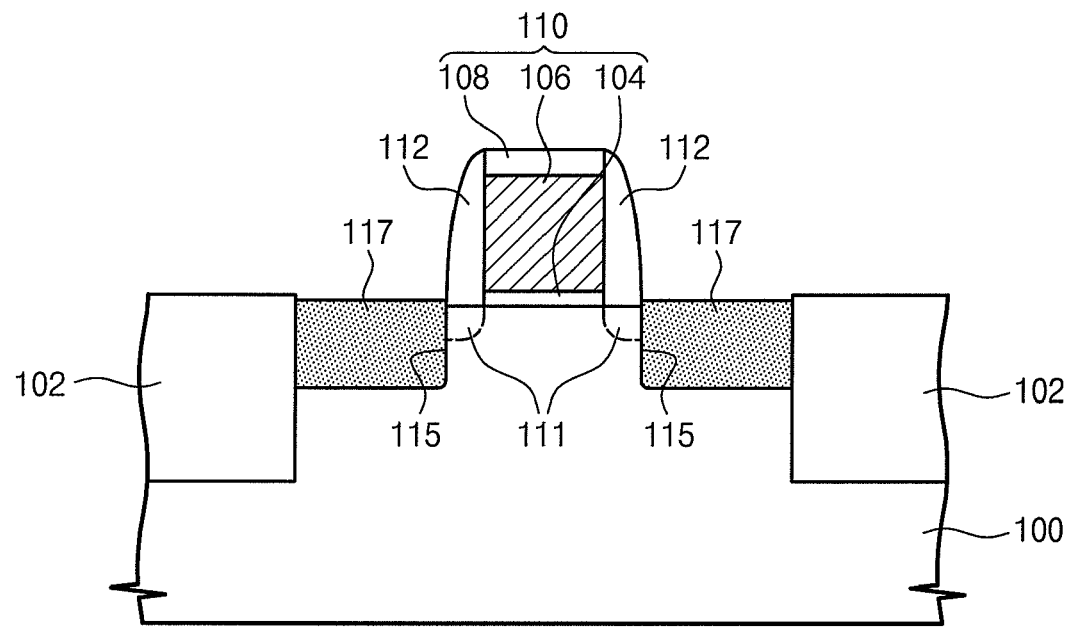

Referring to FIG. 3, a source/drain pattern 117 is formed to fill the recess region 115. The source/drain pattern 117 fully fills the recess region 115. The top surface of the source/drain pattern 117 may be higher than that of the active region. The source/drain pattern 117 is formed of, for example, silicon-germanium. As the atomic size of germanium is larger than that of silicon, the source/drain pattern 117 formed of silicon-germanium supplies a compressive force to a channel region below the gate electrode 106. Thus, mobility of carriers migrating along the channel region increases when a transistor is turned on. As a result, the operating speed of a transistor including the source/drain pattern 117 is enhanced to increase the operating speed of a highly integrated semiconductor device.

To achieve a sufficient efficiency in mobility of the carriers, a proportion of germanium amount to the sum of silicon amount and germanium amount in the source/drain pattern 117 is about 15 percent to about 90 percent (wherein the germanium amount means the number of germanium atoms, and the silicon amount means the number of silicon atoms). A proportion of germanium amount to the sum of germanium amount and silicon amount in a pattern or layer will be defined hereinafter as a germanium proportion. Accordingly, a proportion of germanium amount to the sum of germanium amount and silicon amount in the source/drain pattern 117 may be defined as a germanium proportion of the source/drain pattern 117. For example, the germanium proportion of the source/drain pattern 117 is about 15 percent to about 30 percent.

For example, the mobility of holes migrating along the channel region may increase due to a compressive force of the source/drain pattern 117. Accordingly, it may be that the first-type dopants are N-type dopants and the second-type dopants are P-type dopants. That is, the transistor including the source/drain pattern 117 is a PMOS transistor. The gate electrode 106 may have a work function that is suitable for a gate of a PMOS transistor. The gate electrode 106 may be formed of, for example, silicon doped with P-type dopants. Alternatively, the gate electrode 106 may be formed of another conductive material having a work function that is close to the valence band of silicon.

The formation of the source/drain pattern 117 may be done by means of, for example, a selective epitaxial growth. Therefore, the source/drain pattern 117 may exhibit a single-crystalline state due to the substrate 100. The source/drain pattern 117 is doped with second-type dopants. That is, the source/drain pattern 117 is formed of, for example, doped silicon-germanium. The source/drain pattern 117 may be doped by means of, for example, in-situ doping. Alternatively, the source/drain pattern 117 may be doped by means of, for example, ion implantation. The dopant-doped region 111 is in lateral contact with the source/drain pattern 117 to electrically communicate therewith. A dopant concentration of the dopant-doped region 111 may be much lower than or approach that of the source/drain pattern 117.

Figure 4:
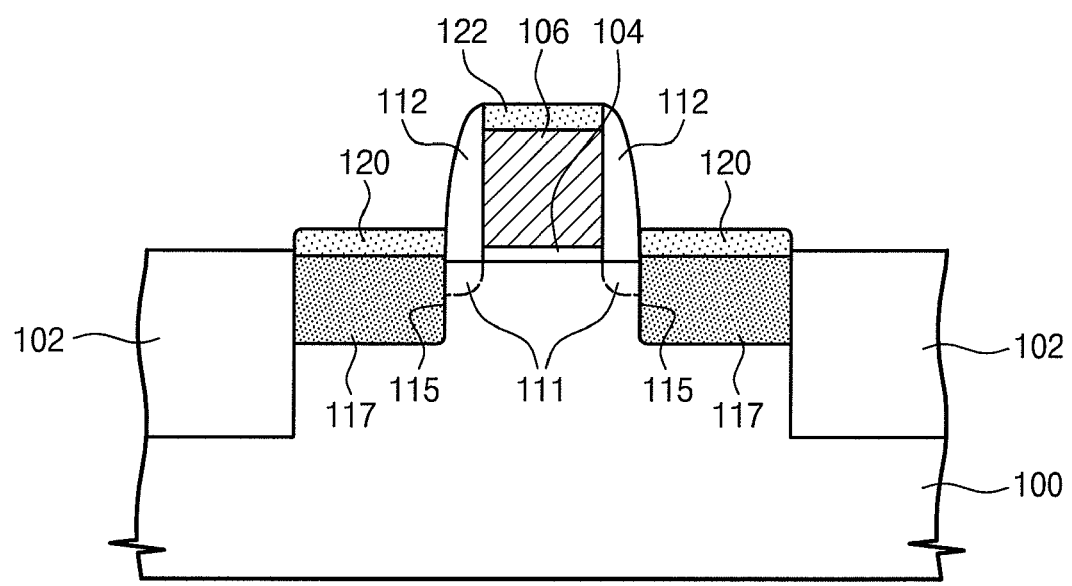

Referring to FIG. 4, the hard mask pattern 108 is removed to expose the top surface of the gate electrode 106 formed of doped silicon. The hard mask pattern 108 and the gate spacer 112 have an etch selectivity with respect to each other. In the case where the gate electrode 106 is formed of another conductive material except doped silicon, a process for removing the hard mask pattern 108 may be omitted.

A first capping layer 120 is formed on the top surface of the source/drain pattern 117. The first capping layer 120 is formed of silicon-germanium. A germanium proportion of the first capping layer 120 is lower than that of the source/drain pattern 117. The formation of the first capping layer 120 is done by means of, for example, selective epitaxial growth. Thus, the first capping layer 120 may be formed only on the source/drain pattern 117. Due to the source/drain pattern 117, the first capping layer 120 may exhibit a single-crystalline state. When the first capping layer 120 is formed, a second capping layer 122 may be formed on the exposed gate electrode 106. The second capping layer 122 is also formed of, for example, silicon-germanium. The second capping layer 122 may exhibit a poly-crystalline state. The first capping layer 120 may exhibit an undoped state. Alternatively, the first capping layer 120 may be doped with second-type dopants.

As described above, the germanium proportion of the first capping layer 120 is lower than that of the source/drain pattern 117. For example, the germanium proportion of the first capping layer 120 is about 5 percent to about 10 percent. The first capping layer 120 of silicon-germanium is formed on the source/drain pattern 117 of silicon-germanium to enhance a growth rate of the first capping layer 120.

If a pure silicon layer is formed on a silicon-germanium layer having a germanium proportion of about 20 percent by means of epitaxial growth, a growth rate of the pure silicon layer may be approximately 0.03 angstrom per second. On the contrary, if a silicon-germanium layer having a germanium proportion of about 10 percent is formed on a silicon-germanium layer having a germanium proportion of about 20 percent, a growth rate of the silicon-germanium layer having a germanium proportion of about 10 percent may be approximately 0.15 angstrom per second. Namely, the grow rate of the silicon-germanium layer having a germanium proportion of about 10 percent is about five times higher than that of the pure silicon layer.

In conclusion, the first capping layer 120 may be formed of silicon-germanium to make throughput of the first capping layer higher than in the case where a pure silicon layer is formed on the source/drain pattern 117.

The concentration of germanium in the first capping layer 120 may have various types, which will now be described below with reference to FIGS. 7A, 7B, and 7C.

Figure 7A:
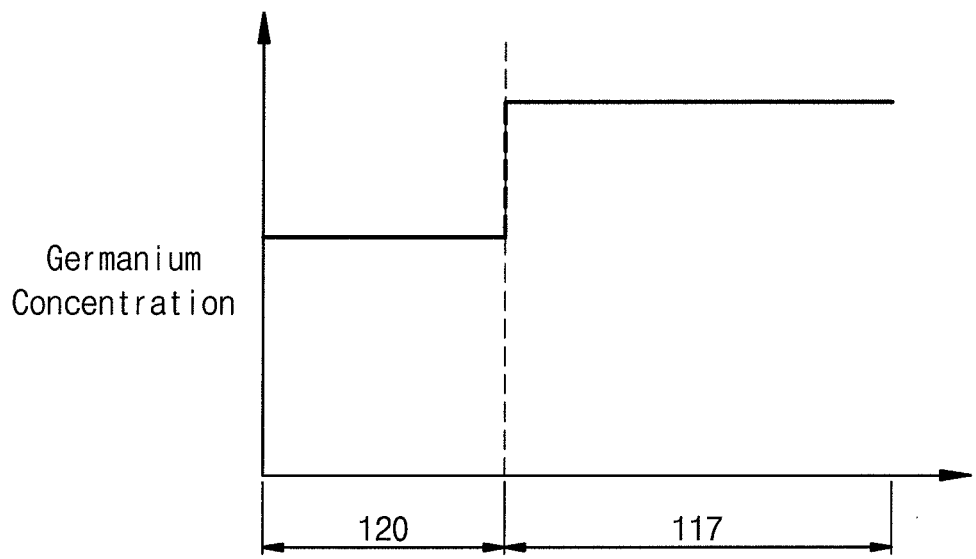
FIG. 7A is a graph showing a type of the concentration of germanium in a capping layer in the method of forming a semiconductor device according to an exemplary embodiment of the present invention.
Figure 7B:
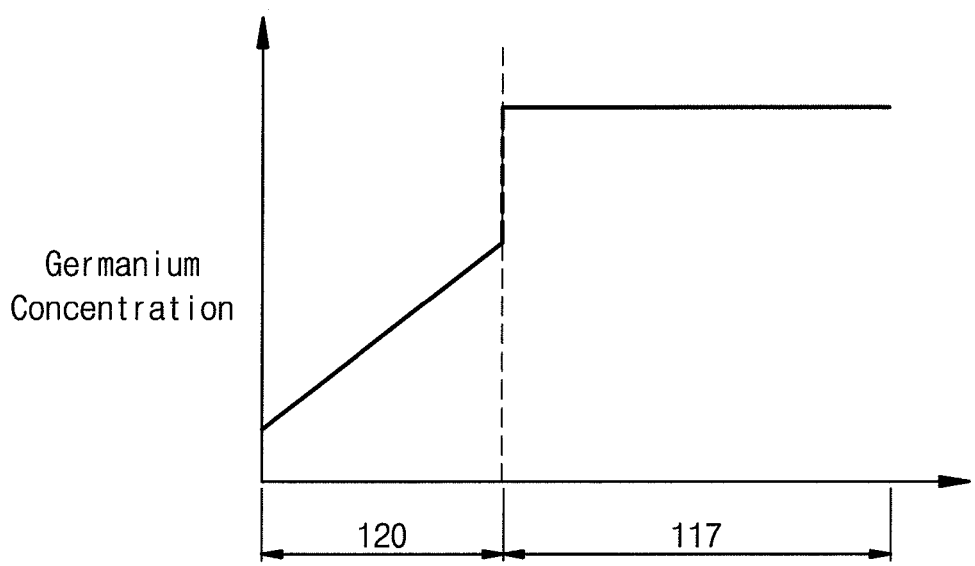
FIG. 7B is a graph showing another type of the concentration of germanium in a capping layer in the method of forming a semiconductor device according to an exemplary embodiment of the present invention.

FIG. 7A is a graph showing a type of the concentration of germanium in a capping layer in the method of forming a semiconductor device according to an exemplary embodiment of the present invention, and FIG. 7B is a graph showing another type of the concentration of germanium in a capping layer in the method of forming a semiconductor device according to the present invention. FIG. 7C is a graph showing still another type of the concentration of germanium in a capping layer in the method of forming a semiconductor device according to an exemplary embodiment of the present invention. In the graphs, x-axis denotes a depth from the top surface of a capping layer and y-axis denotes a germanium concentration.

Referring to FIGS. 4, 7A, 7B, and 7C, as described above, a germanium proportion of the first capping layer 120 is lower than that of the source/drain pattern 117. The germanium concentration of the source/drain pattern 117 may substantially be uniform throughout the source/drain pattern 117. The germanium concentration of the first capping layer 120 and the germanium concentration of the source/drain pattern 117 are discontinuous. As shown in FIG. 7A, the germanium concentration of the first capping layer 120 may substantially be uniform throughout the first capping layer 120.

Figure 7C:
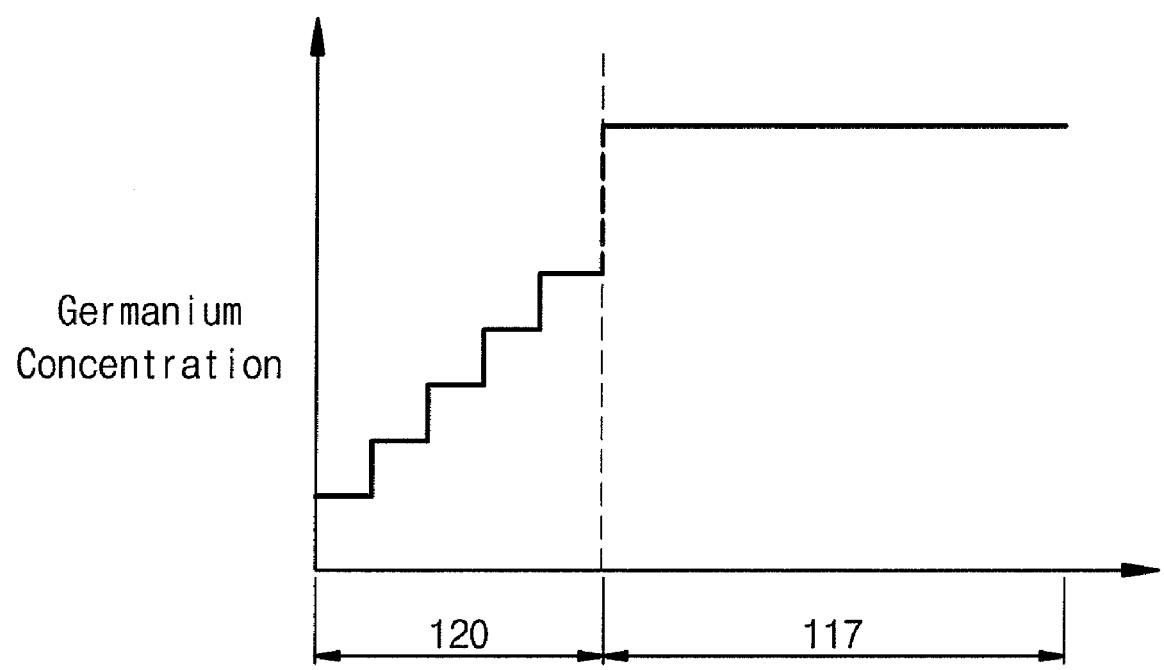
FIG. 7C is a graph showing still another type of the concentration of germanium in a capping layer in the method of forming a semiconductor device according to an exemplary embodiment of the present invention.

Alternatively, as shown in FIGS. 7B and 7C, the germanium concentration at the top surface of the first capping layer 120 may be lower than that at the bottom surface of the first capping layer 120. In this case, both the germanium proportion at the bottom surface of the first capping layer 120 and the germanium proportion at the top surface of the first capping layer 120 may be about 5 percent to about 10 percent.

For example, as shown in FIG. 7B, the germanium concentration of the first capping layer 120 may gradually decrease from the bottom surface to the top surface of the first capping layer 120. Alternatively, as shown in FIG. 7C, the germanium concentration of the first capping layer 120 may discontinuously decrease from the bottom surface of the first capping layer 120 to the top surface of the second capping layer 122. In other words, the first capping layer 120 may include a plurality of regions that have a substantially uniform germanium concentration and are stacked sequentially. In a pair of adjacent regions among the plurality of regions, a germanium concentration of an overlying one is lower than that of an underlying one.

A germanium proportion, a germanium concentration, and distribution-shapes of germanium concentration of the second capping layer 122 formed on the gate electrode 106 may be identical to those of the first capping layer 120.

Figure 5:
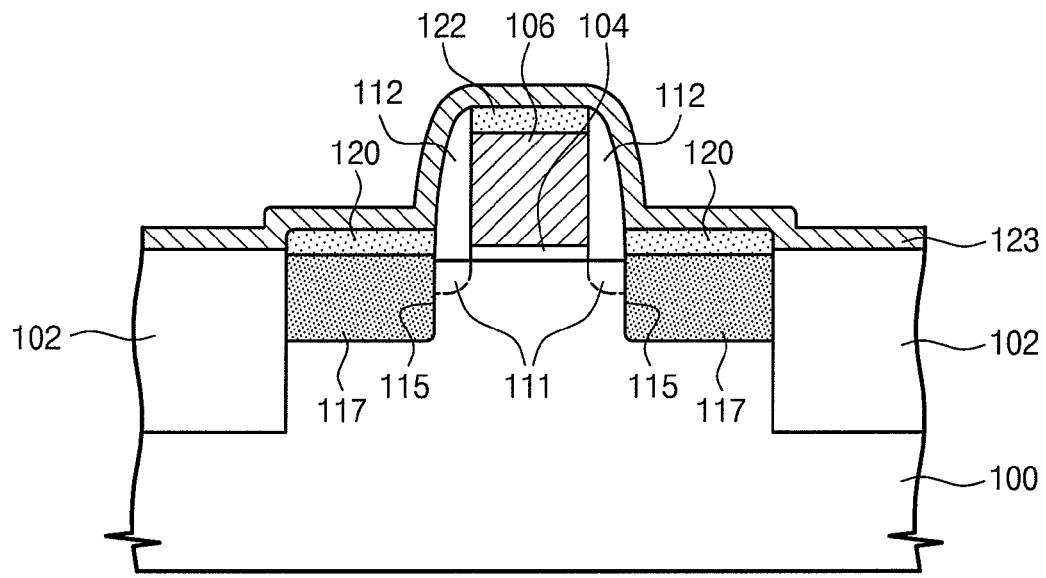

Referring to FIG. 5, a metal layer 123 is formed on the entire surface of the substrate 100 including the first and second capping layers 120 and 122. The metal layer 123 may be formed of, for example, nickel. Alternatively, the metal layer 123 may be formed of another metal such as, for example, cobalt or titanium. The metal layer 123 is in contact with the first capping layer 120 as well as the second capping layer 120.

Figure 6:
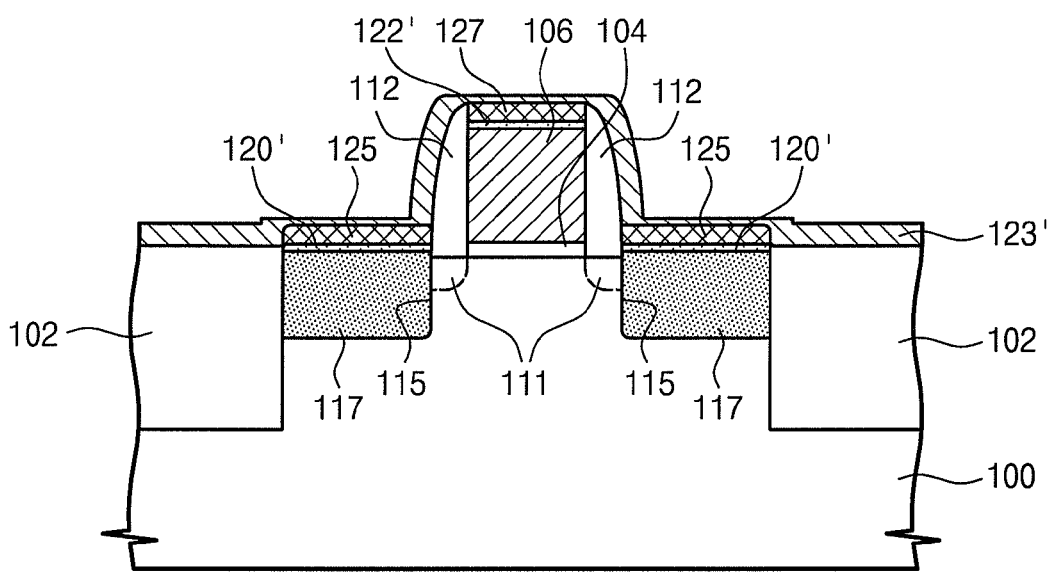

Referring to FIG. 6, an annealing process is performed for the substrate 100 including the metal layer 123, allowing the metal layer 123 and the first capping layer 120 to react to each other. Thus, a first metal germanosilicide layer 125 is formed on the source/drain pattern 117. The annealing process also allows the metal layer 123 and the second capping layer to react to each other, forming a second metal germanosilicide layer on the gate electrode 106. The first meal germanosilicide layer 125 includes metal of the metal layer 123 and silicon and germanium of the first capping layer 120. The second metal germanosilicide layer 127 includes metal of the metal layer 123 and silicon and germanium of the second capping layer 122. In the case where the first capping layer 120 is doped with dopants, the first and second metal germanosilicide layers 120 and 122 may further include dopants. The process of forming the metal layer 123 and the annealing process are included in a germanosilicidation process.

The annealing process may be performed in-situ with the process of forming the metal layer 123. Alternatively, the annealing process may be performed after forming the metal layer 123. Especially in the case where the metal layer 123 is made of nickel, the annealing process may include a first annealing treatment and a second annealing treatment. The process temperature of the first annealing treatment is lower than that of the second annealing treatment. The first annealing treatment may be performed at a temperature ranging from about 300 degrees centigrade to about 400 degrees centigrade, and the second annealing treatment may be performed at a temperature ranging from about 400 degrees centigrade to about 450 degrees centigrade.

In the case where the metal layer 123 is formed of nickel, the first and second metal germanosilicide layer 125 and 127 are formed of nickel germanosilicide. In the case where the metal layer 123 is formed of cobalt or titanium, the first and second metal germanosilicide layer 125 and 127 are formed of cobalt germanosilicide or titanium germanosilicide.

Due to the first capping layer 120, the germanium proportion of the first metal germanosilicide layer 125 is lower than that of the source/drain pattern 117. Due to the first capping layer 120, the germanium proportion of the first metal germanosilicide layer 125 is about 5 to about 10 percent. The distribution of the germanium proportion of the first metal germanosilicide layer 125 results from the first capping layer 120. Thus, the germanium concentration of the first metal germanosilicide layer 125 may be uniform throughout. Alternatively, the germanium concentration at the top surface of the first metal germanosilicide layer 125 may be lower than that at the bottom surface of the first metal germanosilicide layer 125. In this case, the germanium concentration of the first metal germanosilicide layer 125 may gradually decrease from the bottom surface to the top surface or discontinuously decrease. A germanium proportion, a germanium concentration, and a distribution of the germanium concentration of the second metal germanosilicide layer 127 may be identical to those of the first metal germanosilicide layer 125.

During the annealing process, the metal layer 123 may react to upper portions of the first and second capping layers 120 and 122. Thus, a lower portion 120' of the first capping layer 120 may remain between the first metal germanosilicide layer 125 and the source/drain pattern 117. Further, a lower portion 122' of the second capping layer 122 may remain between the second metal germanosilicide layer 125 and the gate electrode 106. The remaining lower portion 120' is defined as a first buffer conductive pattern 120', and the remaining upper portion 122' is defined as a second buffer conductive pattern 122'. In this case, the first capping layer 120 is in the state of being doped with second-type dopants. Accordingly, the first and second metal germanosilicide layers 125 and 127 are each electrically connected to the gate electrode 106 and the source/drain pattern 117 through the first and second conductive patterns 120v and 122'.

The germanium proportion of the first metal germanosilicide layer 125 is equal to or lower than that of the first buffer conductive pattern 120'. The first and second buffer conductive patterns 120' and 122' are a lower portion of the first capping flayer 120 and a lower portion of the second capping layer 122, respectively.

Figure 9:
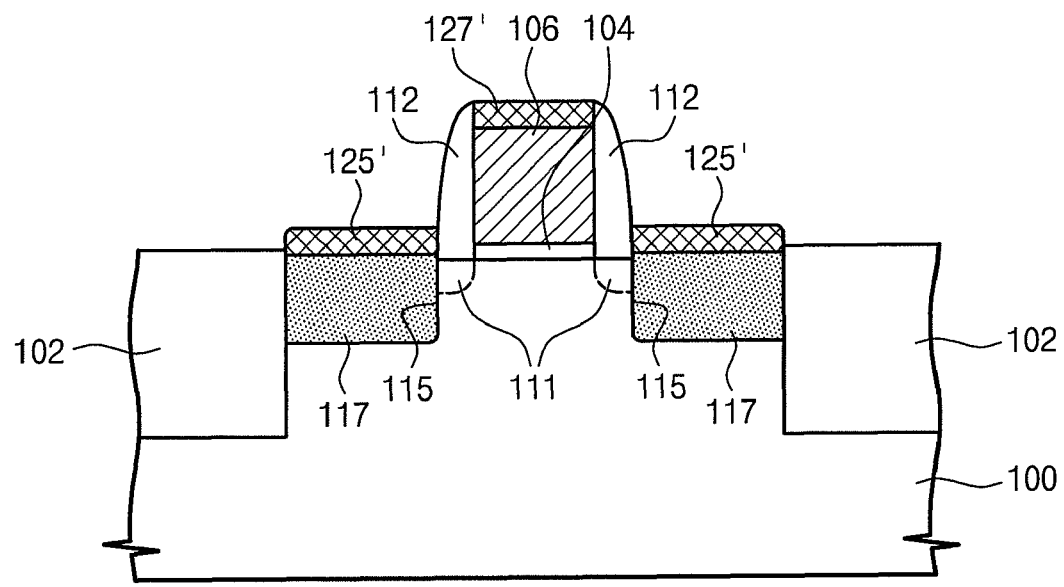
FIG. 9 is a cross-sectional view of a semiconductor device according to an exemplary embodiment of the present invention.

Alternatively, during the annealing process, the metal layer 123 reacts to the entirety of the first capping layer 120 to form a metal germanosilicide layer 125' of FIG. 9. The metal germanosilicide layer 125' may be in direct contact with the source/drain pattern 117. In this case, the first capping layer 120 may be doped with second-type dopants or undoped. As the bonding force between metal (especially, e.g., nickel) and silicon is stronger than that between metal (especially, e.g., nickel) and germanium, germanium may serve to suppress metal-silicon bonding. For this reason, during the germanosilication process performed to form the semiconductor device shown in FIG. 9, the source/drain pattern 117 having a discontinuously high germanium proportion may serve as a reaction barrier.

Figure 8:
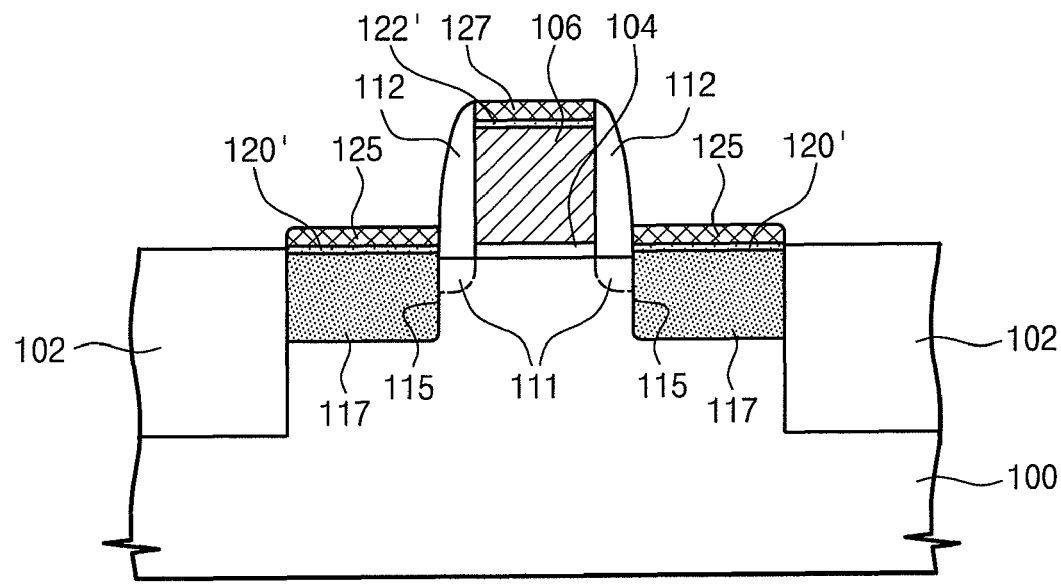
FIG. 8 is a cross-sectional view of a semiconductor device according to an exemplary embodiment of the present invention.

Thereafter, a non-reactive portion of the metal layer 123' is removed during the annealing process to form semiconductor devices shown in FIG. 8 or 9.

As described above, the first metal germanosilicide layer 125 is formed by reaction of the metal layer 123 to the first capping layer 120 having a lower germanium concentration than the source/drain pattern 117. That is, the germanium concentration of the first metal germanosilicide layer 125 decreases due to the first capping layer 120. Accordingly, the resistance of the first metal germanosilicide layer 125 may decrease and degradation at the boundary of the first metal germanosilicide layer 125 may be suppressed. The boundary of the first metal germanosilicide layer 125 means the boundary between the first metal germanosilicide layer 125 and the first buffer conductive pattern 120' or the boundary between the first metal germanosilicide layer 125 and the source/drain pattern 117. As a result, an electric resistance between the source/drain pattern 117 and a contact structure being in contact with the first metal germanosilicide layer 125 decreases to achieve a transistor operating at a high speed.

In the case where a germanium concentration of a metal germanosilicide increases, a ternary compound of metal-silicon-germanium increases in agglomerate amount. Thus, the resistance of the metal germanosilicide may increase and characteristics at the boundary of the metal germanosilicide may be degraded. In the case where a proportion of germanium amount to the sum of silicon amount and germanium amount in a silicon-germanium layer is about 15 percent or above, the agglomerate amount may increase significantly.

Alternatively, according to the foregoing exemplary embodiment, after the first capping layer 120 having a low germanium proportion of about 5 to about 10 percent is formed on the source/drain pattern 117 having a germanium proportion of about 15 percent or above, the germanosilication process is performed to form the first metal germanosilicide layer 125. Thus, the germanium proportion of the first metal germanosilicide layer 125 may be reduced to significantly decrease the above-mentioned agglomerate amount. As a result, the resistance of the first metal germanosilicide layer 125 may be lowered and degradation of boundary characteristics may be suppressed.

Due to the first capping layer 120, the first metal germanosilicide layer 125 is formed on the source/drain pattern 117 to prevent metal from penetrating the channel region. Thus, a transistor having beneficial characteristics may be achieved.

According the above-described method, the first capping layer 120 has a smaller germanium proportion than the source/drain pattern 117. Therefore, the resistance of the first metal germanosilicide layer 120 may be lowered and degradation of boundary characteristics may be suppressed. As the first capping layer 120 has a small amount of germanium, the growth rate of the first capping layer 120 may be enhanced. Thus, the time required for forming a transistor is reduced to improve throughput and achieve a transistor operating at a high speed and having beneficial characteristics.

A semiconductor device according to an exemplary embodiment of the present invention will now be described below with reference to accompanying drawings.

FIG. 8 illustrates a semiconductor device according to an exemplary embodiment of the present invention. Referring to FIG. 8, a device isolation layer 102 is disposed on a semiconductor substrate 100 to define an active region. The active region is a portion of the substrate 100 and doped with first-type dopants. A gate insulator 102 and a gate electrode 104 are sequentially stacked on the active region. A source/drain pattern 117 is disposed to fill a recess region 115 formed at the active region adjacent to opposite sides of the gate electrode 104. The source/drain pattern 117 is made of, for example, doped silicon-germanium (silicon being doped with second-type dopants). A germanium proportion of the source/drain pattern 117 is about 15 to about 90 percent. For example, the germanium proportion of the source/drain pattern 117 may be about 15 to about 30 percent.

A gate spacer 112 is disposed on opposite sidewalls of the gate electrode 104. A dopant-doped region 111 doped with second-type dopants may be disposed at the active region below the gate spacer 112. The dopant-doped region 112 is in lateral contact with the source/drain pattern 117. The source/drain pattern 117 disposed to fill the recess region 115 may extend underneath the gate spacer 112. In this case, the dopant-doped region 115 may be omitted.

The first-type dopants are N-type dopants, and the second-type dopants are P-type dopants. That is, a transistor including the gate electrode 104 and the source/drain pattern 117 is a PMOS transistor.

A first metal germanosilicide layer 125 is disposed on the source/drain pattern 117. A germanium proportion of the first metal germanosilicide layer 125 is smaller than that of the source/drain pattern 117. For example, the germanium proportion of the first metal germanosilicide layer 125 is about 5 to about 10 percent. As previously described with reference to FIG. 6, the germanium concentration of the first germanosilicide layer 125 may substantially be uniform throughout. Alternatively, the germanium concentration at the top surface of the first metal germanosilicide layer 125 may be lower than that at the bottom surface of the first metal germanosilicide layer 125. In this case, the germanium concentration of the first metal germanosilicide layer 125 may gradually decrease from the bottom surface to the top surface or discontinuously decrease.

A second metal germanosilicide layer 127 may be disposed on the gate electrode 104. The gate spacer 112 may extend upwardly to cover opposite sidewalls of the second metal germanosilicide layer 127. Agermanium proportion and a germanium concentration of the second metal germanosilicide layer 127 may be equal to those of the first metal germanosilicide layer 125. Each of the first and second metal germanosilicide layers 125 and 127 may be made of, for example, nickel germanosilicide. Alternatively, each of the first and second metal germanosilicide layers 125 and 127 may be made of, for example, cobalt or titanium.

A first buffer conductive pattern 120' may be interposed between the first metal germanosilicide layer 125 and the source/drain pattern 117. A second conductive buffer 122' may be interposed between the second metal germanosilicide layer 125 and the gate electrode 104. Each of the first and second buffer conductive patterns 120' and 122' is made of silicon-germanium and doped with second-type dopants. Thus, the first metal germanosilicide layer 125 is electrically connected to the source/drain pattern 117 through the first buffer conductive pattern 120'. The properties of germanium in the first and second buffer conductive patterns 120' and 122' are previously described with reference to FIG. 6 and will not be described in further detail.

A semiconductor device according to another exemplary embodiment of the present invention will now be described below with reference to accompanying drawings.

FIG. 9 illustrates a semiconductor device according to another exemplary embodiment of the present invention. Referring to FIG. 9, a source/drain pattern 117 is disposed to fill a recess region 115 formed at an active region formed at opposite sides adjacent to a gate electrode 104. A first metal germanosilicide layer 125' is disposed on the source/drain pattern 117. The metal germanosilicide layer 125' is in direct contact with the source/drain pattern 117. A second metal germanosilicide layer 127' may be disposed on the gate electrode 104. The second metal germanosilicide layer 127' is direct contact with the gate electrode 104.

A germanium proportion of the first metal germanosilicide layer 125' is lower than that of the source/drain pattern 117. For example, the germanium proportion of the first metal germanosilicide layer 125' is about 5 to about 10 percent. A germanium concentration of the first germanosilicide layer 125' may substantially be uniform throughout. Alternatively, the germanium concentration at the top surface of the first metal germanosilicide layer 125' may be lower than that at the bottom surface of the first metal germanosilicide layer 125'. In this case, the germanium concentration of the first metal germanosilicide layer 125' may gradually decrease from the bottom surface to the top surface or discontinuously decrease.

A germanium proportion and a germanium concentration of the second metal germanosilicide layer 127' may be equal to those of the first metal germanosilicide layer 125'. Each of the first and second metal germanosilicide layers 125' and 127' may be made of, for example, nickel germanosilicide, cobalt germanosilicide or titanium germanosilicide.

To sum up, a source/drain pattern of silicon-germanium may be formed to fill a recess region formed at opposite sides adjacent to a gate electrode. Thus, the source/drain pattern may supply a compressive force to a channel region below the gate electrode to increase the mobility of carriers migrating along the channel region. As a result, a transistor operating at a high speed may be achieved. A capping layer of silicon-germanium may be formed on the source/drain pattern, allowing the capping layer and a metal layer to react to each other during a germanosilicidation process. A germanium proportion of the capping layer is lower than that of the source/drain pattern. Thus, the growth rate of the capping layer may be increased to enhance the production yield of semiconductor devices. Further, the resistance of the metal germanosilicide formed on the source/drain pattern may be lowered and degradation of boundary characteristics may be suppressed. As a result, the operating speed of a transistor may be further enhanced. As the capping layer and the metal layer react to each other, the distance between the germanosilicide layer and the channel region may increase to prevent metal used in a germanosilicidation process from penetrating the channel region. Thus, a high-speed transistor having beneficial characteristics may be achieved.

Having described the exemplary embodiments of the present invention, it is further noted that it is readily apparent to those skilled in the art that various substitutions, modifications and changes may be made without departing from the scope and spirit of the invention which is defined by the metes and bounds of the appended claims.

What is claimed is:

1. A semiconductor device comprising:
   a gate insulator and a gate electrode stacked on a substrate;
   a source/drain pattern which fills a recess region formed at opposite sides adjacent to the gate electrode, the source/drain pattern being made of silicon-germanium doped with dopants; and
   a metal germanosilicide layer disposed on the source/drain pattern, the metal germanosilicide layer being electrically connected to the source/drain pattern,
   wherein a proportion of germanium amount to the sum of the germanium amount and silicon amount in the metal germanosilicide layer is lower than that of germanium amount to the sum of the germanium amount and silicon amount in the source/drain pattern.

2. The semiconductor device as recited in claim 1, wherein the proportion of germanium amount to the sum of the germanium amount and silicon amount in the source/drain pattern is about 15 percent to about 90 percent.

3. The semiconductor device as recited in claim 1, wherein the proportion of germanium amount to the sum of the germanium amount and silicon amount in the metal germanosilicide layer is about 5 percent to about 10 percent.

4. The semiconductor device as recited in claim 1, further comprising:
   a gate spacer disposed on opposite sidewalls of the gate electrode.

5. The semiconductor device as recited in claim 1, wherein the substrate is doped with N-type dopants and the source/drain pattern is doped with P-type dopants.

6. The semiconductor device as recited in claim 1, wherein a germanium concentration of the metal germanosilicide layer is substantially uniform throughout the metal germanosilicide layer.

7. The semiconductor device as recited in claim 1, wherein a germanium concentration at the top surface of the metal germanosilicide layer is lower than that at the bottom surface of the metal germanosilicide layer.

8. The semiconductor device as recited in claim 1, wherein the metal germanosilicide layer is in direct contact with the source/drain pattern.

9. The semiconductor device as recited in claim 1, wherein the metal germanosilicide layer is made of nickel germanosilicide.

* * * * *